(12) United States Patent
Bedner et al.

(10) Patent No.: US 6,194,233 B1
(45) Date of Patent: Feb. 27, 2001

(54) INTEGRATED CIRCUIT AND METHOD OF MANUFACTURE FOR AVOIDING DAMAGE BY ELECTROSTATIC CHARGE

(75) Inventors: Thomas R. Bedner, Essex Junction; Paul S. Zuchowski, Fletcher, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/137,741

(22) Filed: Aug. 21, 1998

(51) Int. Cl.⁷ .................................................. H01L 21/66
(52) U.S. Cl. ................................................. 438/14; 438/14
(58) Field of Search ............................. 438/14, 258, 288, 438/257, 453, 593, 622, 647, 612, 599, 910

(56) References Cited

U.S. PATENT DOCUMENTS

| | | | |
|---|---|---|---|
| 5,278,105 | 1/1994 | Eden et al. ...................... | 437/250 |
| 5,393,701 | * 2/1995 | Ko et al. ......................... | 437/193 |
| 5,500,542 | * 3/1996 | Iida et al. ........................ | 257/210 |
| 5,514,623 | 5/1996 | Ko et al. ......................... | 437/193 |
| 5,654,897 | 8/1997 | Tripathi et al. ................. | 364/489 |
| 5,990,519 | * 11/1999 | Huang et al. ................... | 257/357 |
| 6,002,155 | * 12/1999 | Tahara et al. ................... | 257/355 |

OTHER PUBLICATIONS

Derwent Abstracts, Abstract TW 93111050 A 19931228, "Method for the naturally formed layout of die—can eliminate the antenna effect".

* cited by examiner

Primary Examiner—David Nelms
Assistant Examiner—David Nhu
(74) Attorney, Agent, or Firm—Pollock, Vande Sande & Amernick, RLLP; Richard M. Kotulak

(57) ABSTRACT

A process for designing CMOS integrated circuits which prevents electrostatic charges from damaging a gate of a connected transistor. Once the routing of a metallic conductors for the integrated circuit is defined, a determination is made whether or not a conductor connects to the gate of a transistor and violates an antenna rule. A metallic conductor involved in an identified violation is traced along its length for a location on an adjacent layer which is free of metallic conductors. The metallic conductor is segmented at the location providing a split conductor having spaced apart ends. Subsequent processing of the layer avoids the accumulation of excessive charge on the split conductor. The first and second segments are reconnected during processing of the adjacent metalization layer through via holes connected to the spaced apart segments.

9 Claims, 4 Drawing Sheets

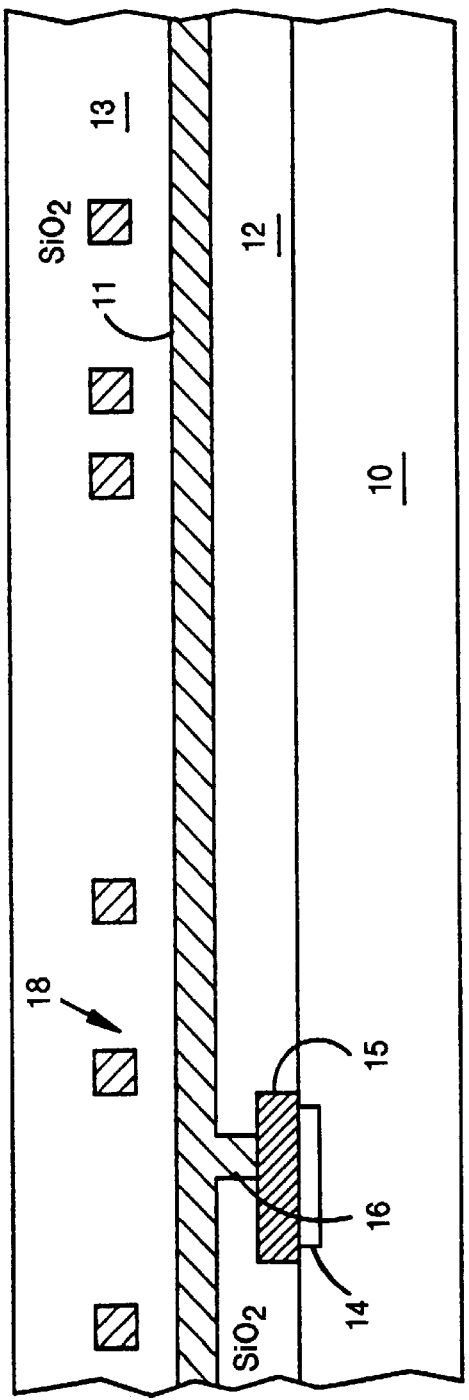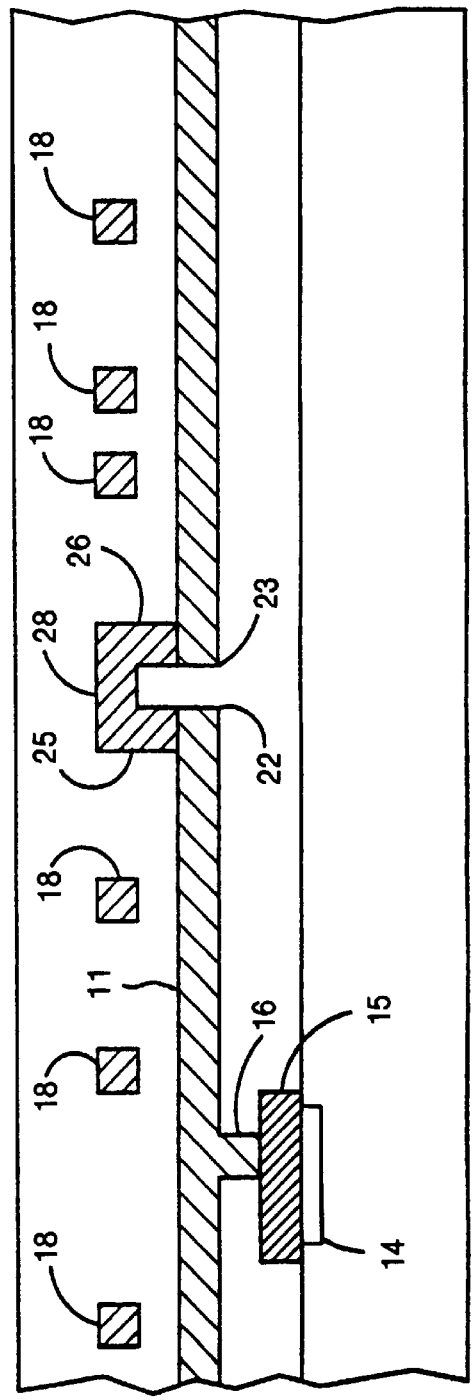

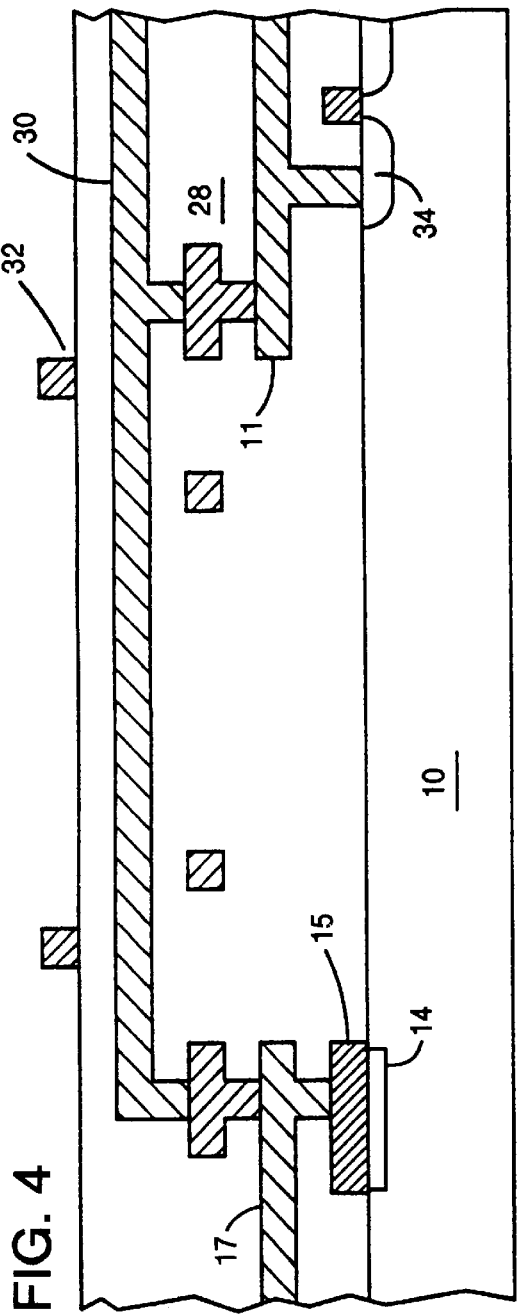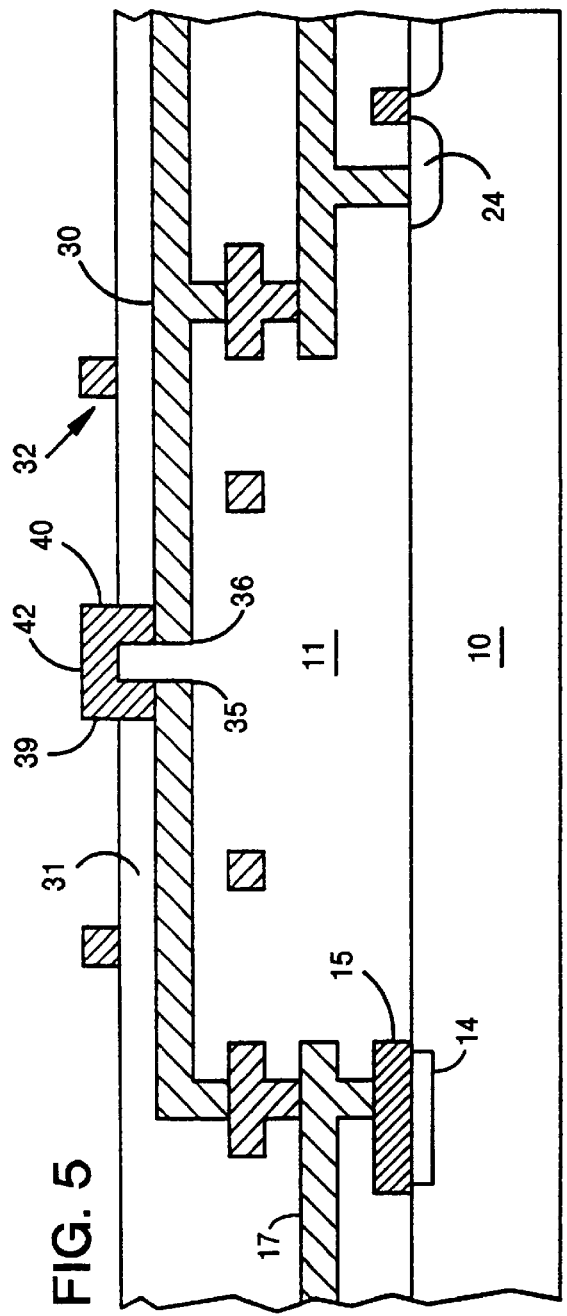

INTEGRATED CIRCUIT AND METHOD OF MANUFACTURE FOR AVOIDING DAMAGE BY ELECTROSTATIC CHARGE

BACKGROUND OF THE INVENTION

The present invention relates to the manufacture of CMOS integrated circuits. Specifically, a method for designing integrated circuits which prevents an excessive electrostatic charge from accumulating on circuit conductors during manufacture is described.

Custom CMOS integrated circuit technologies require a processing step which is known as a Reactive Ion Etch (RIE) to process the various metal layers of an integrated circuit. In the ASIC (Application Specific Integrated Circuit) environment for manufacturing custom logic circuits, components such as processors, memory arrays, and input and output interface circuits are integrated in a custom circuit and interconnected by metal wiring layers. The RIE process for establishing the connections of a layer may result in electrostatic charge being built up on the metal lines of each layer which may be applied to the transistor gates permanently damaging the transistor.

The problem of electrostatic charge building up on metal lines during fabrication is well known and numerous solutions have been proposed. Various techniques have been employed to reduce or dissipate the charge as it builds up on the metal lines to avoid damaging the connected transistor. A common charge dissipation technique is to build floating gate diodes on each circuit input pin, which connects to a gate, to slowly bleed off the electrostatic charge as it accumulates on the metal line. However, as circuit densities increase, it is more difficult to find sufficient surface area for locating floating gate diodes, whose only function is to protect the gates during manufacture. The floating gate diodes remain as permanent circuit elements adversely affecting performance and power dissipation of the integrated circuit.

Instead of placing floating gate diodes on each input pin, the full chip designs may be checked before implementation into silicon for potential problem areas where charge is likely to build up during fabrication. An antenna rule has been devised to identify locations within the metalization layers where charge may accumulate to a level which damages the gate oxide of a connected transistor. The antenna rule compares the surface area presented by a metallic conductor connected to a gate, and the actual gate area. The antenna rule is applied by considering the metalization area of each layer. At the first of such layers, such as M1, all metalization segments which are ultimately connected to a diffusion area are not subject to the rule since the diffusion area dissipates any charge accumulating on the metal segments. The remaining segments which connect to gate connections, and have the potential for destroying the gate oxide level, are subject to the antenna rule. Multiple segments of the metalization level M1 may be connected to each other and to multiple gates. A violation occurs if the sum of commonly connected metalization areas, compared to the sum of the gate areas connected to the commonly connected metalization area exceed the established threshold. Those electrically connected metalization segments that do not pass the antenna rule risk gate failures from excessive electrostatic charge.

When the metallic conductor area on a given layer to gate area threshold is above a recognized value, the rule is violated which identifies a potential problem. The design can be changed to provide different routing and metal wiring connections to avoid the consequence of lengthy metalized lines and the resulting charge buildup.

However, the process of redesign to avoid the metal/gate area threshold violation is iterative in nature, requiring numerous changes to the metal wiring routing and several checks for each change.

The present invention utilizes the antenna rule to identify and locate metal areas which violate the rule. However, the violations once located are avoided by a process which only changes the design locally without disturbing the remaining metalization layers and circuit interconnectivity.

SUMMARY OF THE INVENTION

It is an object of this invention to avoid the accumulation of excessive electrostatic charge on a circuit metalization line during fabrication of an integrated circuit.

This and other objects of the invention are provided for by a method which produces an integrated circuit that prevents electrostatic charges from damaging a gate of a connected transistor during manufacture of the integrated circuit. The circuit is designed from a conventional net list provided by a customer which defines the functionality of the integrated circuit. Using conventional ASIC CMOS design techniques, the floor plan for the integrated circuit is created to locate the larger circuit components such as processors, memory arrays and input/output circuits on the integrated circuit. The remaining logic such as gates for interconnecting the larger circuit components are then located on the integrated circuit. The power bus routing among the circuit components as well as signal routing are then established to interconnect the circuit components.

The completed design is checked for floating gate antenna rule violations. The coordinates of each gate connection along with the location of the connected metallic circuit line or lines which violates the antenna rule are identified for each layer of the integrated circuit.

In accordance with the invention, the failing metallic line is traced to locate a position on an adjacent layer above the failing metallic line which is free of metallic wiring. If a sufficient amount of free space is located on the above adjacent level, the metal segment violating the antenna rule is broken. During manufacture of the level containing the broken metal segments, electrostatic charge produced on each segment of the metal level is reduced, thereby avoiding an excessive charge which can destroy the gate of a connected transistor. During subsequent processing steps, the segments are rejoined by connecting a bridge segment on the above adjacent layer, through two or more via holes to the ends of each segment.

The method in accordance with the invention results in a design which calls for the breaking of metalization segments which produce violations of the antenna rule for each layer of metalization, and then reconnecting the segments when the adjacent metal layer above the broken segments has been processed. The technique avoids a costly and tedious redesign of the circuit when antenna violations occur.

DESCRIPTION OF THE DRAWINGS

FIG. 2 illustrates a metallic circuit line/conductor gate configuration on one metalization layer which contains an antenna violation;

FIG. 3 illustrates, in accordance with a preferred embodiment of the invention, a method for avoiding the consequences of high electrostatic charge on the metallic circuit line during manufacture;

FIG. 4 represents another integrated circuit metalization layer having a metallic circuit line which violates the antenna rules;

FIG. 5 illustrates, in accordance with a preferred embodiment of the invention, the technique for avoiding the consequence of antenna rule violations;

DETAILED DESCRIPTION OF THE PREFERRED EMBODIMENT

Figure 1:
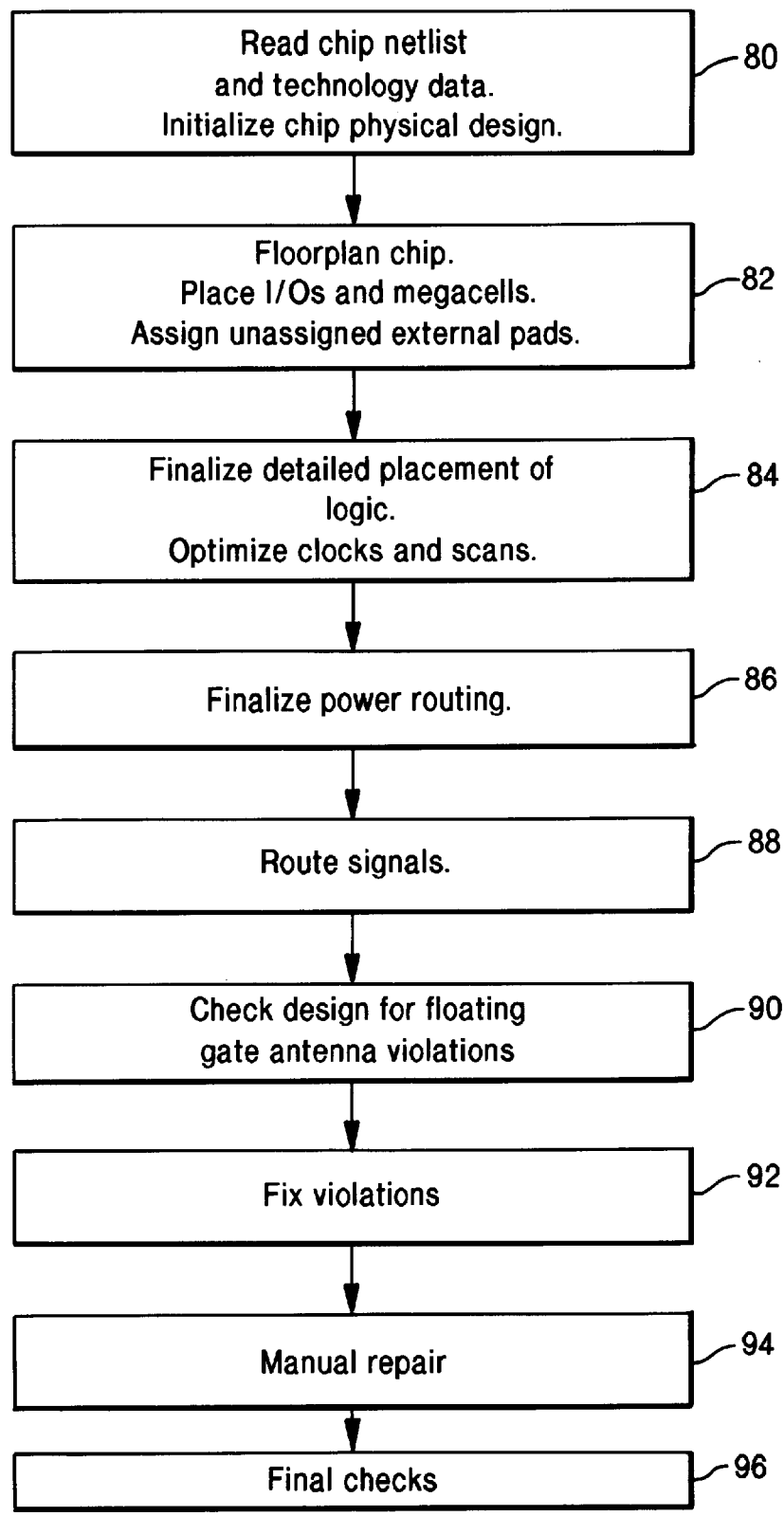
FIG. 1 is an overall block diagram of a method for designing integrated circuits using a preferred embodiment of the invention.

Referring now to FIG. 1, there is shown a series of design steps for the design of a custom CMOS logic circuit in the ASIC environment. The customer provides for each custom logic chip a net list to identify the functionality of the custom logic to the integrated circuit designers.

The high level customer data provided in step 80 is used to create a floor plan in step 82 for the custom logic circuit. The floor plan identifies the location of major circuit elements and the input/output (I/O) circuit on the substrate, along with external circuit pads which are assigned for connection to the I/O circuits.

The remaining portion of the logic circuit is layed out in step 84, including the location of various gates which interconnect the major components. The power bus comprising one or more levels of metalized circuit lines are layed out on the integrated circuit in step 86 for routing operating voltages to the various components. The signals between components are routed via additional metalized circuit lines formed from metalization layers contained on the integrated circuit in step 88. The metalized circuit lines include an automatic wiring target to which other lines are connected.

The foregoing represents conventional design processes for defining the metalization layers, logic gates and component configuration for the integrated circuit. Following the location of the metalization circuit lines for a plurality of layers of the integrated circuit, the design is checked for floating gate antenna violations in step 90.

The determination of floating gate antenna violations is a conventional process step using conventional circuit analyzer tools. One such analyzer, known as the Avant! Hercules DRC checker, determines for each metalization plane connected to a transistor gate, and not connected to a diffusion layer, the ratio of the entire connected metal area to gate area of all gates which are connected to a single electrically connected metal area. When the ratio exceeds a threshold value, the metal area and gate connection is deemed to fail the antenna rule, and the Avant! checker supplies the coordinates of an automatic wiring target (input pin) connected to the metalization segment which has failed the antenna rule on the integrated circuit. In practice, it has been found that only those segments consisting of metallic circuit lines connected to the gate connection, which are also electrically connected to an input pin, are likely to produce an antenna violation. The violations of the antenna rule are corrected in step 92 in accordance with the method of the invention.

Each pin electrically connected to a group of metalization segments whose total area violatles the antenna rule is listed along with the metal level of the metalization segment. The correction of a violation is shown in FIGS. 2 and 3. These corrections are made to the design before any manufacturing processes begin. Thus once the violations are corrected in the design, the design can be implemented in silicon to produce an integrated circuit.

Referring now to FIGS. 2 and 3, a cross-section of a semiconductor substrate having a first metalization layer 11 is shown which is used to form a plurality of circuit lines. The metalization layer 11 is separated from the silicon wafer 10 by a silicon dioxide insulation layer 12. The silicon wafer 10 includes diffusion regions, forming transistors by the tens of thousands covered by a gate oxide 14. Above each diffusion region is a polysilicon gate conductor 15 separated from the diffusion region by the gate oxide layer, which connects to a circuit line formed in the metalization layer 11.

A contact between layers is made through contact 16 as is conventionally known in the semiconductor manufacturing art. The circuit line 11 connects the polysilicon gate conductor 15 to a wiring target or pin (not shown).

The silicon dioxide insulation layer 13 above the metalization layer 11 separates metalization layer 11 from a second metalization layer 18 which forms a plurality of additional circuit lines. The metalization circuit lines 18 usually run perpendicular to metalization layer 11, and may be used to bridge the circuit lines contained in metalization layer 11.

A violation of the antenna rules result from the connecting circuit line contained in metalization layer 11 which is connected to the polysilicon gate conductor 15. In accordance with the preferred embodiment, for each failed pin connected to the gate connection 15, the conductor may be conveniently traced along its length, from the input pin or an automated wiring target on the conductor connections towards the failing metalization plane. Alternatively, the conductor may be traced from the failing gate toward the failing metalization plane.

In accordance with a preferred embodiment of the invention, the metalization layer 18, above metalization layer 11, is searched along the length of conductor 11 for a location which is free of any metal surface. When a location is obtained in metalization layer 18 above metalization layer 11 where the length is free of metalization for a distance equal to or greater than the minimum distance required to place two vias, i.e., the pitch, the location is selected for breaking the circuit line in metalization layer 11 which violates the antenna rule. As shown in FIG. 3, the circuit line is broken producing ends 22 and 23 which are spaced apart a distance equal to substantially the minimum distance between two vias located in the above layer.

In accordance with the design instructions for creating the silicon structure bearing the custom integrated circuit, processing steps up through forming layer 11 will be conducted having the metallic layer segment ends in 22 and 23 separated, thereby avoiding a level of charge accumulation which would damage a transistor gate oxide below the polysilicon gate conductor 15.

The design, however, contemplates reconnecting the segment ends 22 and 23 during the subsequent processing of the second metalization layer 18. A pair of vias 25 and 26 provide a through connection from ends 22 and 23 of layer 11 to layer 18 bearing circuit wire 28.

The foregoing process steps avoid any major redesign to avoid the antenna rule violations. Thus, where in the prior art substantial redesign was necessary, the present invention avoids any significant changes to the circuit design.

The design process represented by FIGS. 2 and 3 are repeated for each metallic layer on the silicon wafer 10. FIGS. 4 and 5 represent the process as applied to a third metallic layer 30 which has been formed on the silicon wafer 10. The metalization layer 30, and gate connection 15 represent a violation of the antenna rule. The conductor formed in the metalization layer 30, and electrically connected to a pin 17, is traced from the pin 17 along the adjacent metalization layer 32, until a region is reached where no metalization 32 is formed for at least the distance needed to locate two vias. A break in metalization layer 30 is created under the identified location which produces ends 35 and 36 of two segments of the circuit line of metalization layer 30. Via holes 39 and 40 support connections to a bridge metalization layer 42 which is fabricated when metalization layer 32 is formed.

Thus, during manufacture, the process steps for creating metalization layer 30 are implemented to produce the gap between segment 35 and 36. The gap is approximately the space require for two vias, and prevents excessive charge from building up on the formerly single segment conductor metalization layer 30. Once the process steps for the metalization layer 30 are completed, the subsequent layer 32, formed above the silicon dioxide insulation 31, may proceed, to include the bridge element 42 for reconnecting the segments of the metalization layer 30.

In the event the adjacent metalization layer 32 does not contain a location free of metalization for at least the space required for two vias, the problem is cured by resorting to various manual techniques known in the art in step 94 of FIG. 1.

Figure 6:
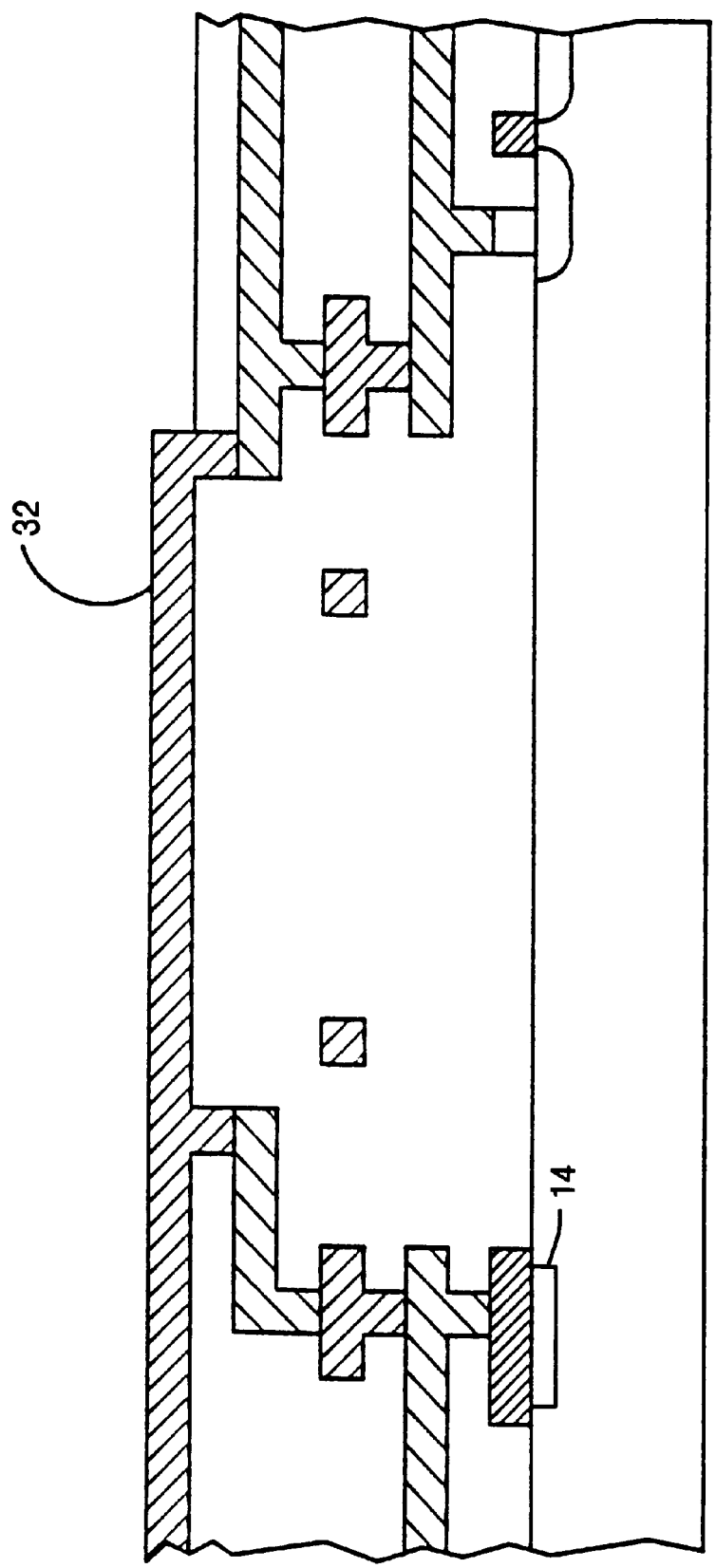
FIG. 6 illustrates the top metalization layer of an integrated circuit which avoid electrostatic charge accumulation.

Shown in FIG. 6 is a diffusion area 24 contained within the silicon wafer 10. As will be evident from FIG. 6, the top metalization layer 32 will never produce an excess electrostatic charge since the top metalization layer 32 always completed the electrical connection between a floating gate and a diffusion region, thus inhibiting an electrostatic charge from collecting on the conductor of the metalization layer 32.

Once the design has been checked for antenna violations, and the appropriate fixes are made to the design to avoid the violations, the final checks of the design are made in step 96. This includes timing checks, ground rule check, layout versus schematic etc.

The foregoing process of identifying antenna violations, and correcting the design to include the appropriate breaks in metalization segments, can be included in the early design phase. As much of the circuit design represented in FIG. 1 is by computer design, the foregoing rules and processes for detecting antenna rule violations and their fixes can be incorporated in the software used to create the design.

Thus, the foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. In a process for designing integrated circuits, a method for preventing electrostatic charges from damaging a gate of a transistor comprising:

determining the routing of metallic conductors for said integrated circuit in a first metalization layer of said integrated circuit;

determining for each metallic conductor formed in said metalization layer connected to a gate of a transistor the ratio of metallic area to gate connection area;

identifying each metallic conductor having a ratio of metallic area to a gate connection area which exceeds a threshold value;

tracing each identified metallic conductor for a location above said identified metallic conductor which is free of metallic conductors;

breaking said identified metallic conductors at said location whereby a split conductor having spaced apart ends is created; and creating first and second vias in an insulation layer which separates said identified metallic conductors and a second adjacent metalization level, and connecting said ends through said vias following creation of said second adjacent metalization layer, whereby said gates are protected from excessive charge build up prior to connecting said ends of said metallic conductors.

2. The method for preventing electrostatic charges from damaging a gate of a connected transistor according to claim 1 wherein said location is selected to provide a space along the direction of said identified conductors which is at least an amount of space required by two vias.

3. The method for preventing electrostatic charges from damaging a gate of a connected transistor according to claim 1 further comprising:

identifying each metallic conductor which does not include a location on an adjacent layer which is free of metallic conductors and which has a ratio of metallic area to a connected gate area greater than said threshold for a manual repair.

4. The method for preventing electrostatic charges from damaging a gate of a connected transistor according to claim 1 wherein said metallic conductor ends are spaced the minimum distance between two vias on said level.

5. The method for preventing electrostatic charges from damaging a gate of a connected transistor according to claim 1 wherein said step of determining the ratio of the area of each metallic conductor to gate area is limited to those metallic conductors which are connected to an input pin.

6. The method for preventing electrostatic charges from damaging a gate of a connected transistor according to claim 1 wherein said step of tracing the routing of the conductors on said integrated circuit comprises:

locating connection points on said integrated circuit; and tracing the conductors from said connection points towards the failed conductor.

7. A method for designing integrated circuits which prevents during fabrication of each layer of the integrated circuit electrostatic charge from damaging transistors of the integrated circuit comprising:

determining for the first and a plurality of subsequent metalization layers of said integrated circuit each metalization segment which is connected to at least one gate of a transistor;

determining for each of said metalization areas connected to a gate in said each metalization layer whether each of said metalization segments connected to a gate of a transistor violates an antenna rule;

for each segment which violates said rule, locating a position on a layer above said segment which can accommodate a pair of vias;

forming a break in said segment which violates said rule; and creating in said layer above said segment a bridging portion and two vias for reconnecting said break in said segment.

8. The method according to claim 7 wherein said step of determining each metalization segment which violates said antenna rule ignores any segment which is connected to a diffusion region of said integrated circuit.

9. The method according to claim 7 wherein an uppermost layer of said subsequent layers is ignored when determining which of said metalization areas connected to a gate violates said antenna rule.

* * * * *

UNITED STATES PATENT AND TRADEMARK OFFICE
CERTIFICATE OF CORRECTION

PATENT NO. : 6,194,233 B1
DATED : February 27, 2001
INVENTOR(S) : Thomas R. Bednar, Paul R. Zuchowski It is certified that error appears in the above-identified patent and that said Letters Patent is hereby corrected as shown below:

Bednar is spelled incorrectly on the patent. The correct spelling is BEDNAR,. Please delete the second "e" and replace with an "a".

Signed and Sealed this

Eleventh Day of December, 2001

*Attest:*

*Nicholas P. Godici*

NICHOLAS P. GODICI
*Attesting Officer*   *Acting Director of the United States Patent and Trademark Office*